(12) United States Patent
Wang et al.

(10) Patent No.: US 10,613,153 B2
(45) Date of Patent: Apr. 7, 2020

(54) METHOD AND APPARATUS FOR DEFECT PRE-WARNING OF POWER DEVICE

(71) Applicant: ABB Schweiz AG, Baden (CH)

(72) Inventors: Zhao Wang, Beijing (CN); Xiaobing Dong, Beijing (CN); Rongrong Yu, Beijing (CN)

(73) Assignee: ABB Schweiz AG, Baden (CH)

( * ) Notice: Subject to any disclaimer, the term of this patent is extended or adjusted under 35 U.S.C. 154(b) by 139 days.

(21) Appl. No.: 14/785,652

(22) PCT Filed: Apr. 22, 2013

(86) PCT No.: PCT/CN2013/074528
§ 371 (c)(1),
(2) Date: Oct. 20, 2015

(87) PCT Pub. No.: WO2014/172838
PCT Pub. Date: Oct. 30, 2014

(65) Prior Publication Data
US 2016/0077163 A1    Mar. 17, 2016

(51) Int. Cl.
*G01R 31/40* (2020.01)
*G01R 31/327* (2006.01)
(Continued)

(52) U.S. Cl.
CPC ........... *G01R 31/40* (2013.01); *G01R 31/327* (2013.01); *G01R 31/62* (2020.01);
(Continued)

(58) Field of Classification Search
None
See application file for complete search history.

(56) References Cited

U.S. PATENT DOCUMENTS

| 6,446,027 B1 * | 9/2002 | O'Keeffe | G01R 31/02 702/181 |
| 6,494,617 B1 * | 12/2002 | Stokes | G01N 33/28 336/57 |

(Continued)

FOREIGN PATENT DOCUMENTS

| CA | 2666894 A1 | 11/2010 |
| CN | 101251564 A | 8/2008 |

(Continued)

OTHER PUBLICATIONS

ISA/CN International Search Report dated Jan. 9, 2014 re PCT Application No. PCT/CN2013/074528, filed Apr. 22, 2013.
(Continued)

*Primary Examiner* — J. H. Hur
(74) *Attorney, Agent, or Firm* — Taft Stettinius & Hollister LLP; J. Bruce Schelkopf

(57) ABSTRACT

A method for defect pre-warning of a power device may comprise processing measurement data regarding components of the power device based on predetermined severity criteria, to obtain severities of monitoring indexes related to defects of the components. Weights of the monitoring indexes with respect to the defects are determined based on effectiveness of the monitoring indexes for the defects. A defect probability that at least one of the components has each of at least one of the defects is estimated based on the severities and the weights. Some embodiments may achieve more reliable defect probability estimation and in some embodiments defective component probability and/or device healthy may be estimated. Based on the reliable information, it may facilitate to arrange the maintenance before defects involve into a fault and assess a risk of power device operation and control, thereby improving reliability of the power device.

15 Claims, 6 Drawing Sheets

(51) Int. Cl.
  *G01R 31/62* (2020.01)
  *G01R 31/12* (2020.01)
  *G01R 31/34* (2020.01)
  *G01R 31/64* (2020.01)

(52) U.S. Cl.
  CPC ........ *G01R 31/1254* (2013.01); *G01R 31/343* (2013.01); *G01R 31/64* (2020.01)

(56) References Cited

U.S. PATENT DOCUMENTS

| | | | |
|---|---|---|---|
| 6,928,861 B1* | 8/2005 | Rice | G01N 15/04 324/71.4 |
| 8,405,339 B2 | 3/2013 | Zhang et al. | |
| 2005/0286742 A1 | 12/2005 | Rasmussen et al. | |
| 2009/0009351 A1* | 1/2009 | Lamontagne | H02H 5/08 340/646 |
| 2011/0213744 A1* | 9/2011 | Sparling | G05B 23/0227 706/46 |

FOREIGN PATENT DOCUMENTS

| | | |
|---|---|---|
| CN | 101692113 A | 4/2010 |
| CN | 201898519 U | 7/2011 |
| CN | 102221651 A | 10/2011 |
| CN | 102253304 A | 11/2011 |
| CN | 202034166 U | 11/2011 |
| CN | 102981108 A | 3/2013 |
| CN | 103018618 A | 4/2013 |

OTHER PUBLICATIONS

Anonymous: "Smartsub Smartsub Substation condition monitoring," Jan. 1, 2008, pp. 1-4.
"Guide for Condition Evaluation of Oil-immersed Power Transformers(Reactors)," State Grid Corporation of China, Jan. 21, 2008, pp. 1-23, China. Statement of Relevance: Industrial Standard for State Grid and its affiliates.
"Regulations of Condition-Based Maintenance & Test for Electric Equipment," State Grid Corporation of China, Jan. 21, 2008, pp. 1-112, China. Statement of Relevance: Industrial Standard for State Grid and its affiliates.
Chen, Xin-Gang et al., "Transformer Fault Diagnosis Method of Combining DS Evidence Information Fusion," Aug. 2010, pp. 60-70, vol. 8, China. Statement of Relevance: Based on DGA of transformer oil, the fault types and their location in operating transformer are diagnosed.
Abu-Elanien, Ahmed E.B., et al., "Determination of Transformer Health Condition Using Artificial Neural Networks," IEEE Xplore, Jul. 12, 2011, pp. 1-5.
Badicu, Laurentiu et al., "Oil Impregnated Paper Condition Assessment Using Time Spectroscopy Method," IEEE Xplore, Jul. 14, 2011, pp. 1-6.
Warsani, Ninil U.A. et al., "Power Transformer Assessment Adjusted to Tropical Environment and Utility Requirement," IEEE Xplore, Sep. 9, 2011, pp. 1-4.
Ribin, Wang et al., "Fault Diagnosis of Transformer Based on D-S Evidence Theory," Beijing press and Publication Bureau, Apr. 2012, pp. 6-10, China. Statement of Relevance: On the basis of dissolved gases analysis theory is built by grey association entropy algorithm and weighted K-NN algorithm. More reliable evidence information is generated by using evidence combination rule. In the end, the fault of transformer is diagnosed according to the maximum basic credit value.
Hu, Wei-Tao et al., "The Transformer Fault Management Information System Design Based on the Risk Assessment," IEEE, Sep. 17, 2012, pp. 528-531.
EP International Search Report, Application No. 13882907.2, dated Jan. 3, 2017, 10 pp.
First Chinese Office Action, Application No. CN201380077633.6, dated May 24, 2017, 6 pp.
English Translation of previously cited "Guide for Condition Evaluation of Oil-immersed Power Transformers (Reactors)," State Grid Corporation of China, Jan. 21, 2008.
English Translation of previously cited "Regulations of Condition-Based Maintenance & Test for Electric Equipment," State Grid Corporation of China, Jan. 21, 2008.
European Patent Office, Office Action (Communication pursuant to Article 94(3) EPC) issued in corresponding European application No. 13882907.2, dated May 29, 2019 (6 pages).

* cited by examiner

| Defects | DGA | PD | Tan Delta | FRA | Ground Current | ······ |
|---|---|---|---|---|---|---|
| CB1 | 0 | 4 | 5 | 0 | 0 | 0 |
| CB2 | 0 | 0 | 5 | 0 | 0 | 0 |
| DB1 | 0 | 3 | 5 | 0 | 0 | 0 |
| MB1 | 0 | 0 | 0 | 0 | 0 | 0 |
| TB1 | 0 | 0 | 4 | 0 | 0 | 0 |

METHOD AND APPARATUS FOR DEFECT PRE-WARNING OF POWER DEVICE

FIELD OF THE INVENTION

Embodiments of the present disclosure generally relate to a power system and more particularly relate to a method and apparatus for defect pre-warning of a power device.

BACKGROUND OF THE INVENTION

In a power system, there are some key power devices such as a transformer, circuit breaker, power switch, recloser and so on. Once there is a fault in any of the power devices, it might result in a great influence on the whole power system, and sometimes it even might bring about severe accidents. Therefore, the kinds of power devices are important components that have substantial impacts on safe and reliable operations of the power system. That means it is crucial to find incipient faults in these power device as early as possible.

Device maintenance had been performed to find potential problems. Traditionally, the device maintenance is performed based on post-fault repair and/or on a periodical basis. However, such kinds of maintenance have their own drawbacks. For example, faults may occur between maintenance cycles, and in such a case, the maintenance can not reveal defects. On the other hand, the maintenance may also be performed even when there does not exist any defects, i.e., there might be an over-maintenance.

For the above reasons, there had been proposed to adopt on-line monitoring and prognosis to solve the above-mentioned problems. Generally, the on-line monitoring will collects condition data continuously and sends the collected data to prognosis module to perform further prognosis analysis. The maintenance may be performed based on results of prognosis analysis. For example, only if the results show that a power device has a defect with a high probability, maintenance is arranged so that it may be performed before the defect results in a real fault; and when the results show that the power device is operating in a normal condition, it may reduce the maintenance frequency to save man power and cost.

Currently, it has been proposed various schemes such as those based on probabilistic reasoning, decision tree, rough sets, information fusion, statistics, fuzzy mathematics and etc. However, all of these schemes can not provide a satisfactory effect and acceptable accuracy. Therefore, in the art, there is still a need for improving an on-line monitoring and prognosis.

SUMMARY OF THE INVENTION

In view of the foregoing, the present disclosure provides a new solution for defect pre-warning of a power device so as to solve or at least partially mitigate at least a part of problems in the prior art.

According to a first aspect of the present disclosure, there is provided a method for defect pre-warning of a power device. The method may comprise processing one or more measurement data regarding one or more components of the power device based on predetermined severity criteria, to obtain one or more severities of one or more monitoring indexes related to one or more defects of the one or more components; determining one or more weights of the one or more monitoring indexes with respect to the one or more defects, based on effectiveness of the one or more monitoring indexes for the one or more defects; and estimating a defect probability that at least one of the one or more components has each of at least one of the one or more defects, based on the one or more severities and the one or more weights.

In an embodiment of the present disclosure, the method may further comprise: estimating a defect confidence that the at least one of the one or more components has each of the at least one of the one or more defects, based on the one or more weights and the effectiveness of the one or more monitoring indexes.

In another embodiment of the present disclosure, the method may further comprise: estimating a defective component probability that the at least one of the one or more components is a defective component based on the defect probability and the defect confidence.

In a further embodiment of the present disclosure, the method may further comprise estimating a reliability of the power device based on the defective component probability that the at least one of the one or more components is a defective component.

In a yet embodiment of the present disclosure, the method may further comprise adjusting the one or more weights of the one or more monitoring indexes with respect to the one or more defects, based on the one or more severities of the one or more monitoring indexes.

In a still embodiment of the present disclosure, the processing one or more measurement data regarding one or more components of the power device may comprise: determining, from the one or more measurement data, the one or more monitoring indexes related to the one or more defects of the one or more components; and determining, based on the predetermined severity criteria, the one or more severities for the one or more monitoring indexes related to the one or more defects of the one or more components.

In a still further embodiment of the present disclosure, the method may further comprise providing, in response to at least one of the defect probability, the defective component probability and the reliability, a prompt and/or a command so as to take a corresponding measure.

In a yet further embodiment of the present disclosure, the predetermined severity criteria and/or the effectiveness of the one or more monitoring indexes for the one or more defects may be obtained by an off-line processing based on historical data statics.

In a still yet further embodiment of the present disclosure, the method may further comprise verifying and/or modifying at least one of the predetermined severity criteria and the effectiveness of the one or more monitoring indexes, based on the defect probability and an event associated with the defect probability.

In a yet still further embodiment of the present disclosure, the power device may comprise a transformer.

According to a second aspect of the present disclosure, there is also provided an apparatus for defect pre-warning of a warning of a power device. The apparatus may comprise a measurement data processing unit, configured to process one or more measurement data regarding one or more components of the power device based on predetermined severity criteria, to obtain one or more severities of one or more monitoring indexes related to one or more defects of the one or more components; an index weight determination unit, configured to determine one or more weights of the one or more monitoring indexes with respect to the one or more defects, based on effectiveness of the one or more monitoring indexes for the one or more defects; and a defect probability estimation unit, configured to estimate a defect probability that at least one of the one or more components has each of at least one of the one or more defects, based on the one or more severities and the one or more weights.

According to a third aspect of the present disclosure, there is further provided, a computer-readable storage media with computer program code embodied thereon, the computer program code configured to, when executed, cause an apparatus to perform actions in the method according to any embodiment in the first aspects.

According to a forth aspect of the present disclosure, there is provided a computer program product comprising a computer-readable storage media according to the third aspect.

With embodiments of the present disclosure, it may combine the power device failure mechanism and on-line monitoring technology and achieve more reliable defect probability estimation; and in further embodiments, it may further estimate defective component probability and/or the power device reliability. Based on the reliable information, it may facilitate to arrange the maintenance before defects involve into a fault and to assess a risk of power device operation and control, thereby improving reliability of the power device.

BRIEF DESCRIPTION OF THE DRAWINGS

The above and other features of the present disclosure will become more apparent through detailed explanation on the embodiments as illustrated in the description with reference to the accompanying drawings, throughout which like reference numbers represent same or similar components and wherein.

DETAILED DESCRIPTION OF EMBODIMENTS

Hereinafter, a method and apparatus for defect pre-warning of a power device will be described in details through embodiments with reference to the accompanying drawings. It should be appreciated that these embodiments are presented only to enable those skilled in the art to better understand and implement the present disclosure, not intended to limit the scope of the present disclosure in any manner.

In the accompanying drawings, various embodiments of the present disclosure are illustrated in block diagrams, flow charts and other diagrams. Each block in the flowcharts or block may represent a module, a program, or a part of code, which contains one or more executable instructions for performing specified logic functions and indispensible step, operation, or block is illustrated in a dotted line. Besides, although these blocks are illustrated in particular sequences for performing the steps of the methods, as a matter of fact, they may not necessarily be performed strictly according to the illustrated sequence. For example, they might be performed in reverse sequence or simultaneously, which is dependent on natures of respective operations. It should also be noted that block diagrams and/or each block in the flowcharts and a combination of thereof may be implemented by a dedicated hardware-based system for performing specified functions/operations or by a combination of dedicated hardware and computer instructions.

Generally, all terms used in the claims are to be interpreted according to their ordinary meaning in the technical field, unless explicitly defined otherwise herein. All references to "a/an/the/said [element, device, component, means, step, etc]" are to be interpreted openly as referring to at least one instance of said element, device, component, means, unit, step, etc., without excluding a plurality of such devices, components, means, units, steps, etc., unless explicitly stated otherwise. Besides, the indefinite article "a/an" as used herein does not exclude a plurality of such steps, units, modules, devices, and objects, and etc.

For a better understanding of the present disclosure, the following description will be made to embodiments of the present disclosure by taking a transformer as an example. However, as can be appreciated by those skilled in the art, the present disclosure could be applied to any other suitable power device.

Figure 1:
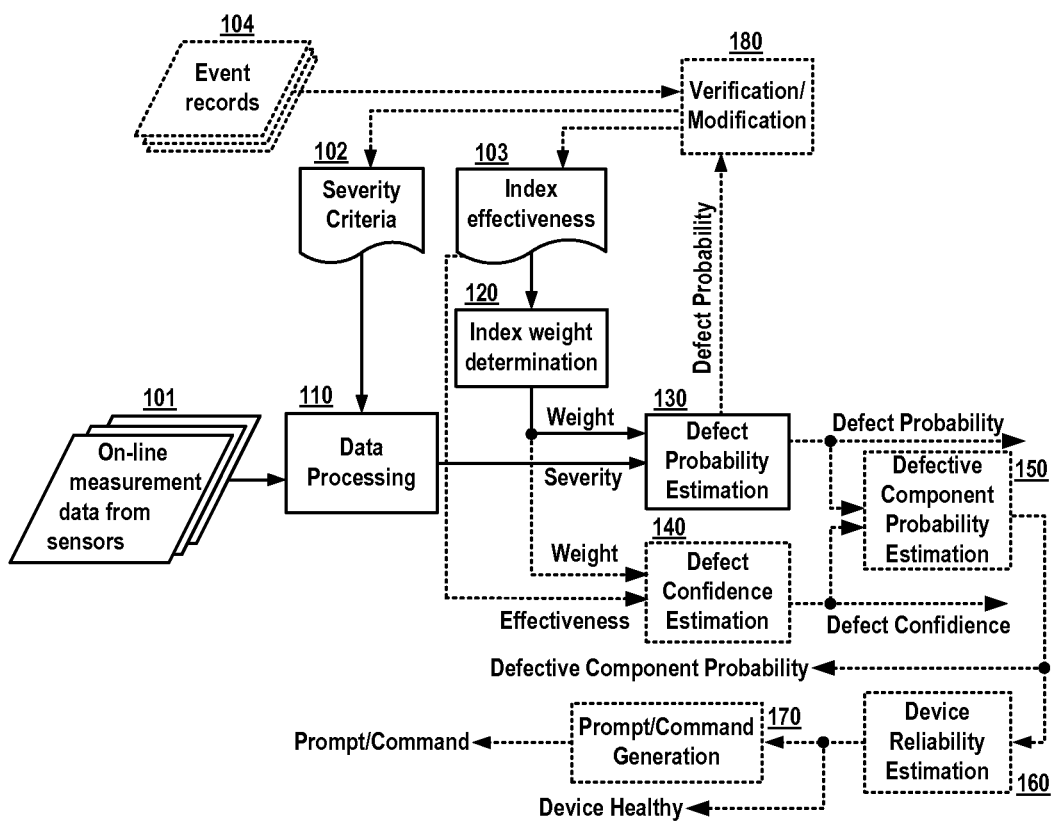
FIG. 1 schematically illustrates an exemplary system architecture according to an embodiment of the present disclosure.

First, reference will made to FIG. 1 to describe an exemplary system architecture of the present disclosure to give an overview of the solution as provide in the present disclosure. As is illustrated in FIG. 1, on-line measurement data 101 from a plurality of sensors for sensing various component of a power device are input into a data processing module 110. In the data process module 110, the measurement data will be processed based on predetermined severity criteria and then outputs severities corresponding to one or more monitoring indexes. The term "severity" used herein means a degree that a value of monitoring index is close to a threshold that will result a defect with a very high probability, which may be represented by, for example, a percentage value.

On the other hand, an index weight determination module 120 will determine weights for the one or more monitoring indexes based on information on an index effectiveness which is also determined in advance. The output weight and severity will be provided to the defect probability estimation module 130, which will estimate the probability that a component may have one or more defects and then outputs the probability.

In an embodiment of the present disclosure, the output defect probability from the defect probability estimation module 130 may be further transmitted to a verification/modification module 180 in which the severity criteria and the index effectiveness may be verify based on the defect probability and/or be adjusted accordingly if necessary.

In another embodiment of the present disclosure, the output weight from the data processing module 110 and the information on monitoring index effectiveness may also be provided to a defect confidence estimation module 140, and the defect confidence estimation module 140 may estimate the defect confidence that a component may have each of one or more defects, based on the effectiveness and the weight. Then the estimated defect confidence and the defect probability output from the defect probability estimation module 130 may be further provided into a defective component probability estimation module 150 which will determine the defective component probability that at least one of power device components are defective based on the input defect probability and defect confidence.

Furthermore, the defective component probability for the at least one of power device components may also be further provided to the device reliability estimation module 160 in which the reliability of the power device will be estimated based on the defective component probability for the at least one of power device components. Additionally, one or more of the defect probability, the defective component probability and the output device reliability may be provided to a prompt/command generation module 170 so that it may generate a prompt and/or a command so as to take a corresponding measure.

Next, detailed operations of the method as provided in the present disclosure will be described with reference to FIGS. 2A to 5.

Figure 2A:
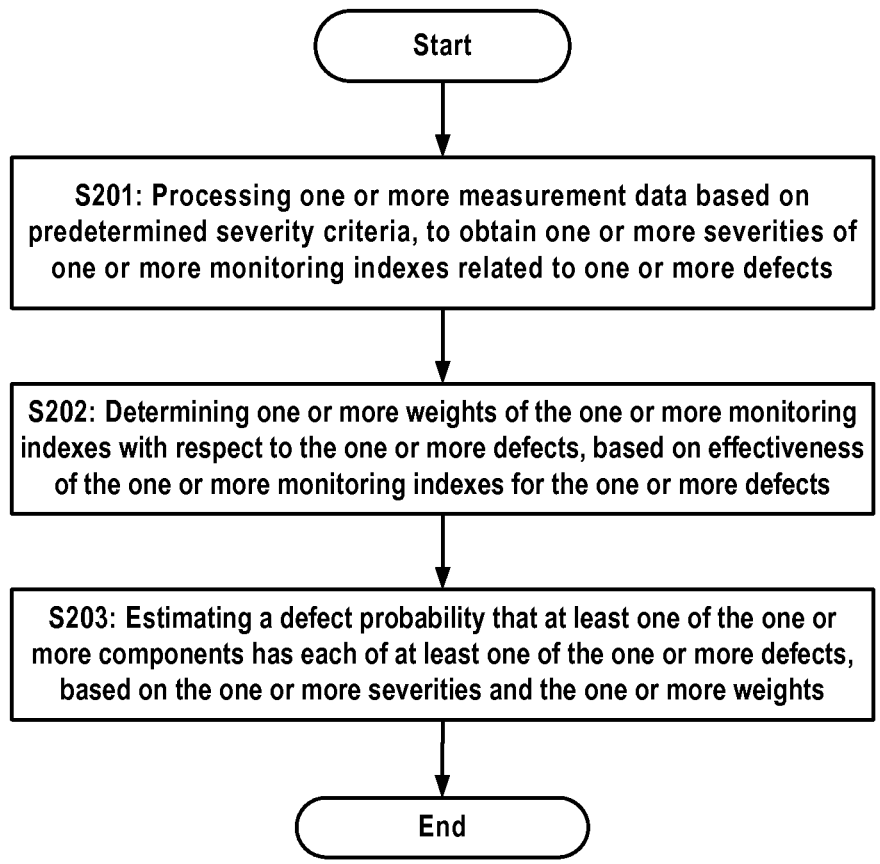
FIG. 2A schematically illustrates a flow chart of a method for defect pre-warning of a power device according to an embodiment of the present disclosure.

As illustrated in FIG. 2A, first as step S201, one or more measurement data regarding one or more components of the power device will be processed based on predetermined severity criteria, to obtain one or more severities of one or more monitoring indexes related to one or more defects of the one or more components.

The one or more measurement data are on-line measurement data which may be received from a plurality of sensors which are arranged to measure various device parameters for the power device on-line or in real time. Taking a power transformer as an example, the measurement data may include, but not limited to, contents of dissolved gases in oil (for example, one or more of H2, CH4, C2H6, C2H4, C2H2, CO, CO2 in ppm, etc), which may reflect the temperature of transformer due to heating or discharge, amplitude and phase of a partial discharge and the number of partial discharge in a predetermined time period, bushing dielectric loss factor tan(δ), a frequency response of windings, ground current for the core and etc.

From the measurement data, the one or more monitoring indexes related to the one or more defects may be determined. The term "monitoring index" user herein is a parameter which is related to a defect and thus may be used to estimate a defect. The monitor index may be an operations parameter such as current, voltage and etc., or a value obtained after analyzing parameters of the power device by means of monitoring technology or analysis approaches. Hereinafter, the monitor indexes may also be called as monitored data, or the monitored data may be understood as values for the monitoring indexes. The monitor indexes may be for example, a bushing dielectric loss factor tan(δ), dissolved gas analysis (DGA), partial discharge (PD), frequency response analysis (FRA), ground current or any other suitable data that may reflect potential issues in the power device.

The measurement data per se may correspond to a monitor index in a one-to-one relation. Nowadays, sensors are coming more and more intelligence and they can sense one or more parameters and provide a monitored data for the power device. Additionally, the measurement data may also correspond to a monitor index in a many-to-one relation. For example, a plurality of sensors may transmit their measurement data to the system of the present disclosure and based on these measurement data, it may calculate or determine a value for a corresponding monitoring index. Therefore, values for monitor indexes may be determined from corresponding measurement data and in a case that the measurement data per se may represent a monitoring index, this step may also be omitted.

Based on these monitored data, the one or more severities may be obtained based on severity criteria, which may be expressed by for example the following equation:

$$S_{ijk} = f(x_{ijk}) \quad \text{(Equation 1)}$$

wherein i denotes an index of components of a power device, wherein i=1, . . . , I and I is the total number of the components to be monitored in the power device; j denotes an index of detects of a component, wherein j=1, . . . J and J is the total number of the defects related to a component; k denotes an index of sensors (or monitoring index determination modules) or monitoring indexes for a defect, wherein k=1, . . . , K and K is the total number of the monitoring indexes; $X_{ijk}$ denotes monitored data (a value for a monitoring index) from the kth sensor or monitoring index determination module of jth defect of the ith component of the power device, $S_{ijk}$ denotes a severity of the kth monitoring index of jth defect of the ith component of the power device; and f( ) denotes a relationship between severities and monitored data, ie., predetermined severity criteria.

The predetermined severity criteria may be in a form of a plot, a table or in any other form that may give the relationship between the severities and monitored data. One way to define f( ) is to interpret a condition assessment specification to form the severity criteria. That is to say, the condition assessment specification generally is maintained by the customer, and if it may be obtained form the customer, the severity criteria may be derived therefrom.

Figure 3A:
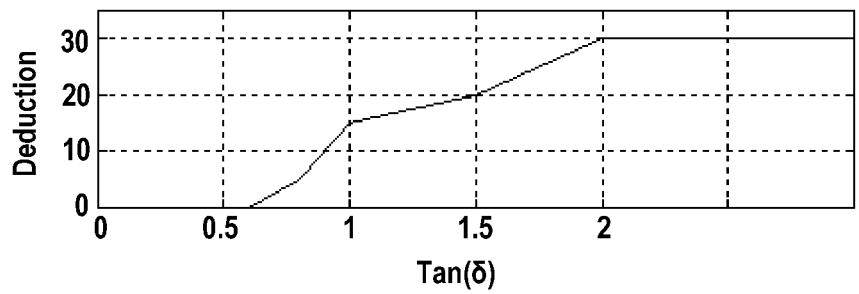
FIG. 3A schematically illustrates a diagram of an exemplary condition assessment specification according to an embodiment of the present disclosure.

FIG. 3A illustrates an exemplary condition assessment specification according to an embodiment of the present disclosure. In FIG. 3A, the lateral axis shows the value of tan(δ), which reflects the bushing dielectric loss factor of the power device; the vertical axis shows a deduction, i.e., the scores that will be deducted if the dielectric loss factor tan(δ) reaches a predetermined value. From FIG. 3A, it is clear that for tan(δ) ranging from 0.6 to 2, it will deduct difficult scores that range from a minimum value of zero to a maximum value of 30. For example, for a tan(δ) of 0.6, a corresponding deduction value is zero; for a tan(δ) of 1, 15 will be deducted; for a tan(δ) of equal to 2, 30 will be deducted.

Figure 3B:
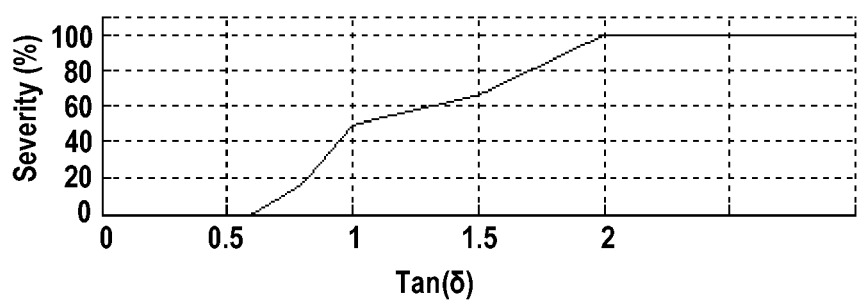
FIG. 3B schematically illustrates a diagram of exemplary severity criteria according to an embodiment of the present disclosure.

In an embodiment of the present disclosure, the predetermined severity criteria may be determined from the condition assessment specification. The maximum deduction value 30 corresponding to tan(δ) of 2 or higher may correspond to 100% severity and the minimum deduction value 0 corresponding to tan(δ) of 0.6 or less may correspond to 0% severity, and so on. In such a way, a severity criteria of bushing dielectric loss factor tan(δ) may obtained, which is illustrated in FIG. 3B. It can be seen from FIG. 3B that the severity criteria have a similar plot variance (although it is not necessary) and a similar lateral axis to those of the condition assessment specification, but the vertical axis has changed from "Deduction" to "Severity (%)."

Figures 4, 5:
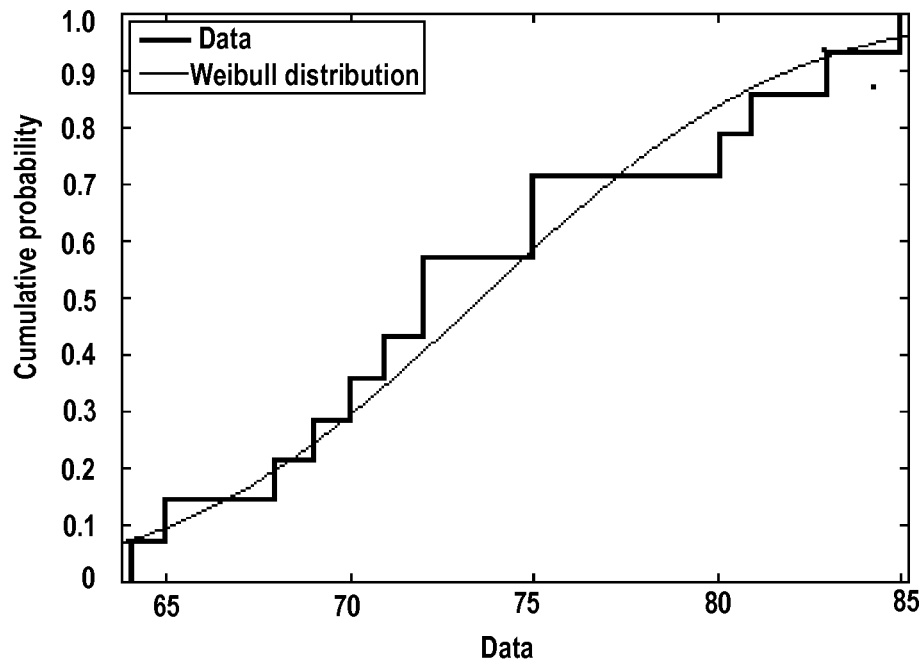
FIG. 4 schematically illustrates a diagram of another exemplary severity criteria according to an embodiment of the present disclosure.
FIG. 5 schematically illustrates of a diagram of an exemplary effectiveness of monitoring indexes for bushing defects according to an embodiment of the present disclosure.

Another way that may be used to define f( ) is to perform an off-line processing based on historical data statics. It may be appreciated that the condition assessment specification is not always available. Thus, the off-line processing may be preferable in this case due to independence of any existing specification. For example, a severity curve may be obtained by combing statistics of historical data of event records. Firstly, it may acquire values for a monitoring index from record events and calculate their cumulative probability which will result in a plot indicated by a step-like line as illustrated in FIG. 4. After that, a weibull distribution of the data may be determined and thus it may result in a curve as shown in a heavy line in FIG. 4. The resulting curve may be used as the predetermined severity criteria. In defining the f( ), it may use data mining technology to facilitate the processing. Besides, the curve may be further adjusted or modified by experts or technicians who have sufficient expertise on defects which can be captured by on-line monitoring or off-line testing.

Please note the severity criteria may also be obtained by another other suitable manners or by means of any other suitable technology and is not limited to the manner described herein. For example, the resulting curve may be determined by any other suitable distribution instead of weibull distribution. Additionally, it is clear that the severity criteria are not limited to a plot or curve in view of form. Actually, it may be represented by a table or a profile which includes different severity values for different values of a monitoring index.

After having obtained such a profile or table, it may obtain, for each of the monitoring indexes, a corresponding severity value by retrieving in the table or searching in the curve.

Then, at Step S202, one or more weights of the one or more monitoring indexes with respect to the one or more defects will be determined based on effectiveness of the one or more monitoring indexes for the one or more defects.

In an embodiment of the present disclosure, the determination of the one or more weights may be represented by for example:

$$W_{ijk}^0 \left( = \frac{\text{logical}(E_{ijk})}{\sum_{k=1}^{K} \text{logical}(E_{ijk})} \right) \quad \text{(Equation 2)}$$

wherein, $W_{ijk}$ denotes a weighing factor of the $k^{th}$ monitoring index of the $j^{th}$ defects of the $i^{th}$ component and the superscript "0" denotes the weighting factor is an initial weight; $E_{ijk}$ denotes effectiveness of the $k^{th}$ monitored index of the $j^{th}$ defects of the $i^{th}$ component; and logical ($E_{ijk}$) denotes a logical value of $E_{ijk}$. In an embodiment of the present disclosure, the logical ($E_{ijk}$) equals to 0 when $E_{ijk}$ is zero and the logical ($E_{ijk}$) equals to 1 when the logical ($E_{ijk}$) is higher than 0. However, it is clear that it may also be determine that the logical ($E_{ijk}$) equals to 1 when $E_{ijk}$ is higher than any other suitable values.

The effectiveness of a monitoring index for a defect means a degree that an estimation result is close to the truth if the monitoring index is used to estimate the defect. FIG. 5 schematically illustrates an exemplary effectiveness of monitoring indexes for bushing defects. The table may be established by off-line processing based on historical data, for example by means of data mining technology. As illustrated in FIG. 5, for the bushing, there are for example five defects, i.e., CB1 and CB2 indicating contamination of the bushing, DB1 indicating a dielectric defect of the bushing, MB1 indicating a mechanical defect of the bushing, and TB1 indicating a thermal defect of the bushing. In the table, there are also listed a plurality of monitoring index such as DGA, PD, Tan Delta (i.e., tan(δ)), FRA, ground current and so on.

From the table, it may be seen that different monitoring indexes have different effectiveness for different defects. Taking the dielectric loss factor tan(δ) as an example, it has an effectiveness of 5 for CB1, CB2 and DB3, an effectiveness of 4 for TB1, and an effectiveness of zero for MB1 (In this table, the maximum value of the effectiveness is 6). That means that the dielectric loss factor tan(δ) has a very high effectiveness in accessing CB1, CB2 and DB3, has a high effective in accessing TB1 and has nothing to do with MB1.

Besides, it may be although the maximum value of effectiveness is set as 6, but the present disclosure is not limited thereto. For example, the maximum value of effectiveness may be determined as another suitable value such as 10. Or alternatively, the value of effectiveness may be a percentage value and the logical ($E_{ijk}$) may be determined based on the percentage value. In such a case, the logical ($E_{ijk}$) equals to 1 when the effectiveness value equals to or higher than a predetermined percentage such as 0% or any other percentage.

By means of the effectiveness table, it may easily determine effectiveness of a monitoring index for a defect by looking up the effectiveness table and in turn determine a weight of a monitoring index based on equation 2.

In another embodiment of the present disclosure, in order to further mitigate the risk of false positive and false negative, the weight or weighting factor may be further adjusted based on the severity of a corresponding monitoring index to get an adaptive weight. Such an adjustment may make an index with higher severity to have a bigger weight. The adjustment may be performed for example in accordance with:

$$W_{ijk}(S_{ij1}, \ldots, S_{ijK}) = W_{ijk}^0 * (S_{ijk})^{a-1} \bigg/ \left( \sum_{l=1}^{K} W_{ijk}^0 * (S_{ijl})^{a-1} \right) \quad \text{(Equation 3)}$$

wherein, $W_{ijk}$ is the weighing factor of the kth monitored index of the jth defect of the ith component; K is the total number of monitored index; $S_{ijk}$ is the severity of the kth index of the jth defect of the ith component, and a is a coefficient which less than 1 (the default number may be for example 0.5). However, it should be noticed that the weight may be adjusted in accordance with any other suitable equations and it is not limited to equation as described herein.

Then at step S203, a defect probability that at least one of the one or more components has each of at least one of the one or more defects is estimated based on the one or more severities and the one or more weights.

That is to say, the probability that a component has a defect may be estimated based on a plurality of monitored indexes related to the defect. Generally, regarding a defect, i.e., a potential fault, it may have one or more symptom which can be captured by sensors. The fusion on data from multiple sensors may bring many advantageous such as mitigating the risk of sensor failure, verifying these data from the multiple sensors, back these data each other.

With these multiple sensors, the probability that the ith component has jth defect may be for example calculated as $$PoD_{ij} = \left( \sum_{k=1}^{K} W_{ijk} * S_{ijk} \right) \quad \text{(Equation 4)}$$

wherein, $PoD_{ij}$ is the probability of the jth defect for the ith component;

$W_{ijk}$ is the weighing factor of the kth monitored index of the jth defect of the $i^{th}$ component, and;

$S_{ijk}$ is the severity (%) of the kth index of the jth defect of the ith component (k=1 . . . K, K represents the number of monitoring indexes), and $0 \le S_{ijk} \le 1$.

In such a way, it may determine a probability that a particular component may have a corresponding defect and output it as an estimation result.

However, in further embodiments of the present disclosure, further processing may be done to provide further estimation results, which will be described with reference to FIG. 2B.

Figure 2B:
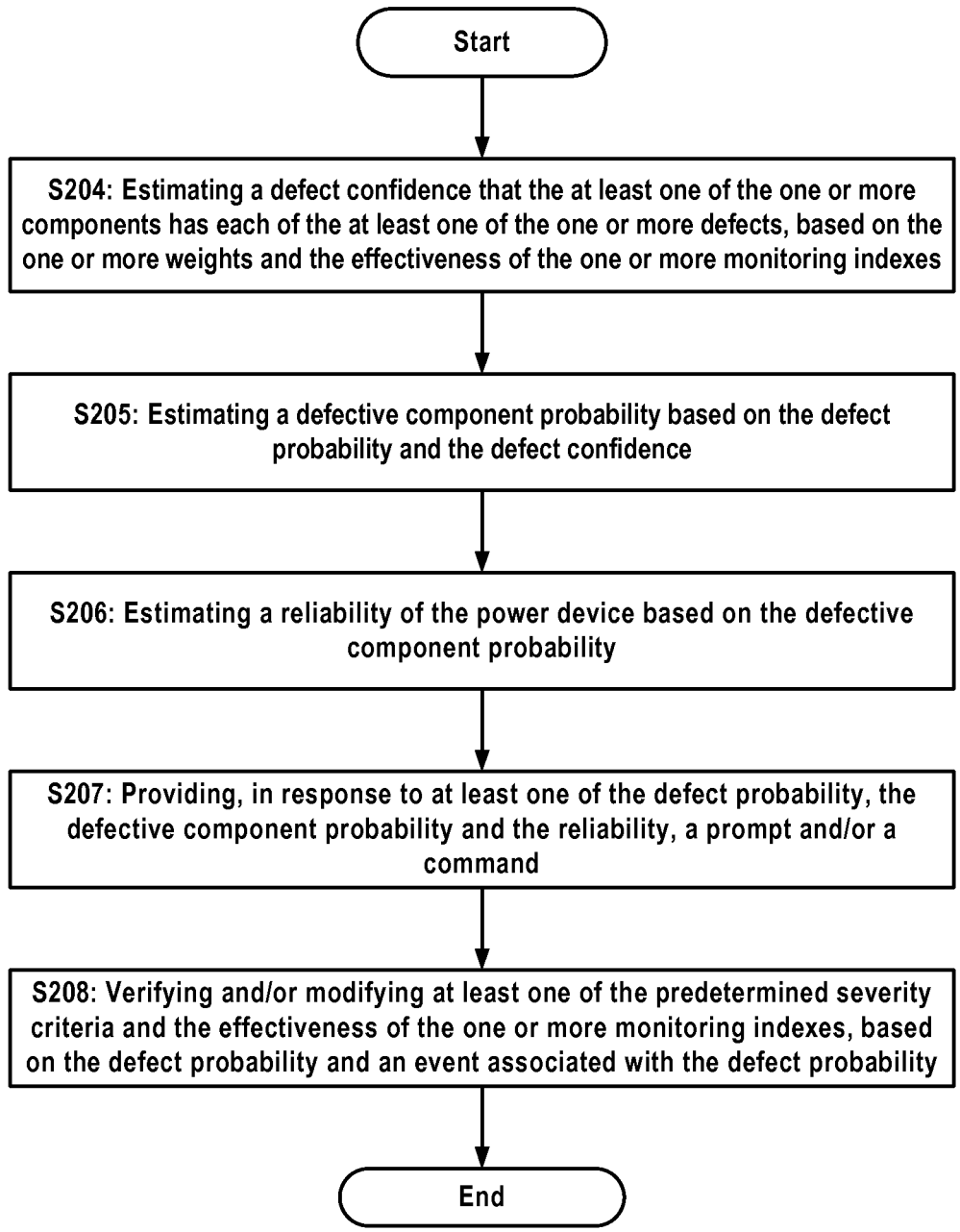
FIG. 2B schematically illustrates a flow chart of a method for defect pre-warning of a power device according to another embodiment of the present disclosure.

As illustrated in FIG. 2B, at step S204, a defect confidence that the at least one of the one or more component has each of the at least one of the one or more defects may be estimated based on the weights and the effectiveness of the one or more monitoring indexes.

The defect confidence may be determined according to, for example, the following equation although it is clear it may also be determined in any other suitable manner:

$$DCoD_{ij} = \sum_{k=1}^{K} W_{ijk} * E_{ijk} / \left( \sum_{k=1}^{K} \text{logical}(E_{ijk}) \right) \quad \text{(Equation 4a)}$$

wherein $DCoD_{ij}$ is the defect confidence that the ith component has the jth defect;

$W_{ijk}$ is the weighing factor of the kth monitored index of the jth defect of the ith component; $E_{ijk}$ denotes the effectiveness of the $k^{th}$ monitored index of the $j^{th}$ defect of the $i^{th}$ component; and logical ($E_{ijk}$) denotes a logical value of $E_{ijk}$.

The $E_{ijk}$ and logical ($E_{ijk}$) may be determined in a similar way to that described with reference to equation 2 and thus will not be elaborated herein. The determined defect confidence may be output it as estimation results together with the defect probability, to show the corresponding confidence. Alternatively or additionally, it may further estimate, at step S205, a defective component probability that the at least one of the one or more components is a defective component based on the defect probability and the defect confidence.

For a component of the power device, it may have one or more main defects which may be captured by sensors. With probability of defects that a component may have respective defects, the probability of defective components may be determined for example as:

$$PoC_{ij} = \max(PoD_{ij} * DCoDi_j) \quad \text{(Equation 5)}$$

wherein $PoC_i$ is the probability of the ith defective component.

$PoD_{ij}$ is the probability of the jth defect of the ith component, and $0 \le PoD_{ij} \le 1$;

$DCoD_{ij}$ is the defect confidence that the ith component has the jth defect; and max( ) denotes a function that solves the maximum value.

That is to say, for ith component, all defect probabilities are multiplied by the corresponding defect confidences respectively and then selected the maximum value of the production as the defective component probability that a component is a defective component. This is reasonable because whether a component is defective or not is usually dependent on the defect with a highest defect probability.

Additionally, it may further estimate reliability or healthy of the power device further based on the determined defective component probability at step S206.

It may be appreciated that a power device may have several inclusive components whose faults will cause the whole health condition of transformer reduced. Based on the defective component probabilities which are determined for a predetermined time intervals. The healthy or reliability of the target defective transformer may be obtained for example by $$RoPD = 1 - \max(PoC_j) \quad \text{(Equation 6)}$$

wherein

RoPD denotes a reliability or healthy of a power device;

$PoC_i$ is the probability of the ith defective component; and max( ) denotes a function that solves the maximum value.

From the equation 6, it may be seen that the reliability of the power device depends on the component that has a maximum defective component probability in the power device.

Besides, at step S207, it may further provide a prompt and/or a command to the customer in response to at least one of estimated defect probability, defective component probability and the reliability, so as to remind or order the customer to take a corresponding measure. This operation may be done especially when any probability related to a defect is relatively high, for example, higher than a predetermined threshold. For example, it may report a warning to indicate that a power device has a low reliability and suggest performing maintenance on the power device, suggest using a backup power device, or any other suitable measures.

Furthermore, it may verify and/or modify at least one of the predetermined severity criteria and the effectiveness of the one or more monitoring indexes, based on the defect probability that at least one of the one or more components has at least one of the one or more defects and an event associated with the defect probability. Taking tan(δ) as an example of the monitoring index, if for a severity of 40% for the monitoring index for CB1, it results a CB1 defect at much higher probability than it should be, then it may adjust the corresponding severity to a higher value, for example 42% or higher; on the other hand, it the CB1 defect occurs at a much lower probability, then the corresponding severity may be reduced to a lower value, for example 38% or lower. Effectiveness of the monitoring indexes may be adjusted in a similar way. In such a way, the severity criteria or effectiveness will be more accurate, and thus, more reliable estimation may be achieved.

With embodiments of the present disclosure, it may combine the power device failure mechanism and on-line monitoring technology and thus may achieve more reliable defect probability estimation; and in further embodiments, it may further estimate defective component probability and/or power device healthy. Based on the reliable information, it may facilitate to arrange the maintenance before defects involve into a fault and assess a risk of power device operation and control, thereby improving reliability of the power device.

Figure 6:
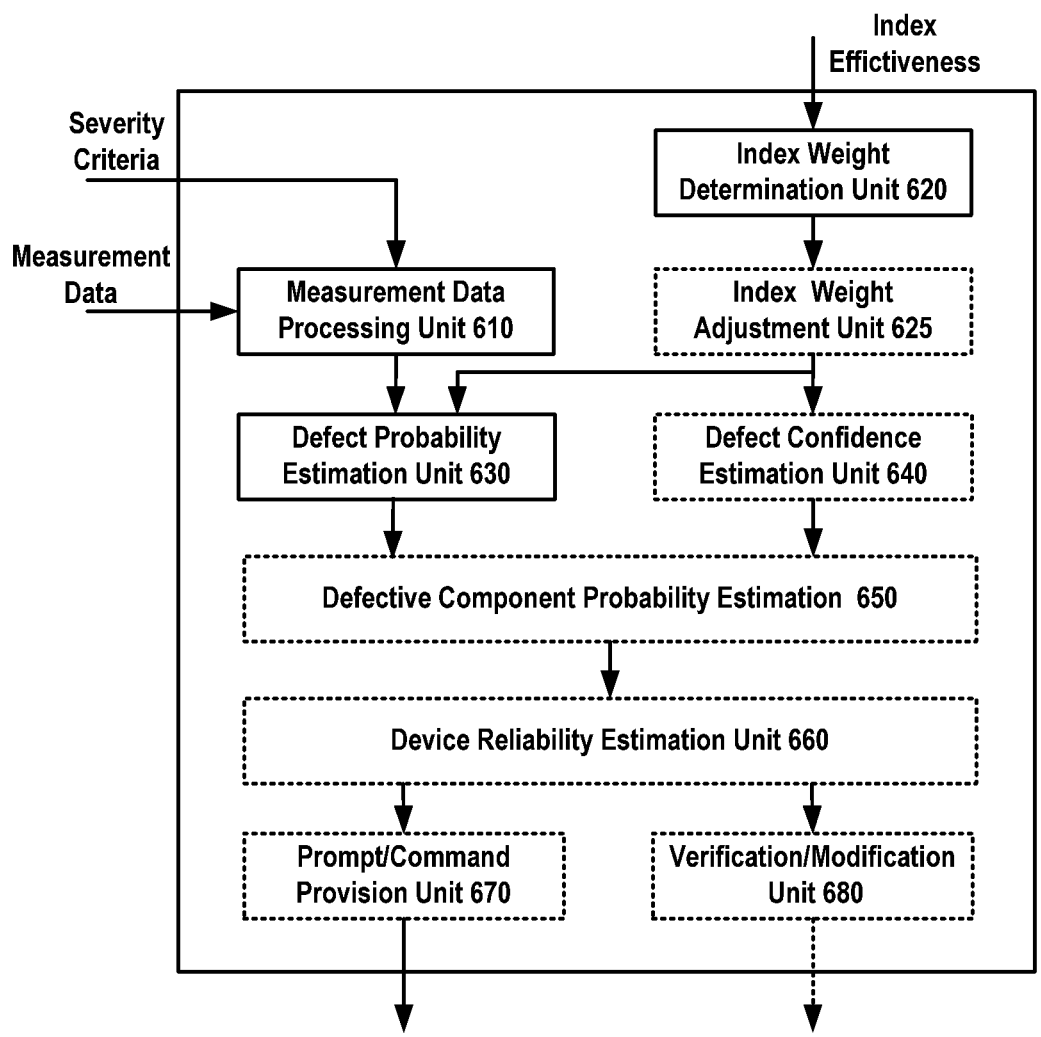
FIG. 6 schematically illustrates a block diagram of an apparatus for defect pre-warning of a power device according to an embodiment of the present disclosure.

In the present disclosure, there is also provided an apparatus for defect pre-warning of a power device which will be described hereinafter with reference to an embodiments as illustrated in FIG. 6.

As illustrated in FIG. 6, the apparatus 600 may comprise: measurement data processing unit 610; an index weight determination unit 620 and a defect probability estimation unit 630. The measurement data processing unit 610 may be configured to process one or more measurement data regarding one or more components of the power device based on predetermined severity criteria, to obtain one or more severities of one or more monitoring indexes related to one or more defects of the one or more components. The index weight determination unit 620 may be configured to determine one or more weights of the one or more monitoring indexes with respect to the one or more defects, based on effectiveness of the one or more monitoring indexes for the one or more defects. The defect probability estimation unit 630 may be configured to estimate a defect probability that at least one of the one or more components has each of at least one of the one or more defects, based on the one or more severities and the one or more weights.

In an embodiment of the present disclosure, the apparatus 600 may further comprise a defect confidence estimation unit 640. The defect confidence estimation unit may be configured to estimate a defect confidence that the at least one of the one or more components has each of the at least one of the one or more defects, based on the one or more weights from the index weight determination unit 620 and effectiveness of the one or more monitoring indexes.

In another embodiment of the present disclosure, the apparatus 600 may further comprise a defective component probability estimation unit 650. The defective component probability estimation unit 650 may be configured to estimate a defective component probability that the at least one of the one or more components is a defective component based on the defect probability and the defect confidence respectively from the defect probability estimation unit 630 and the defect confidence estimation unit 640.

In a further embodiment of the present disclosure, the apparatus 600 may further comprise a device reliability estimation unit 660. The device reliability estimation unit 660 may be configured to estimate a reliability of the power device based on the defective component probability that the at least one of the one or more components is a defective component.

In a further embodiment of the present disclosure, the apparatus 600 may further comprise an index weight adjustment unit 625. The index weight adjustment unit 625 may be configured to adjust the one or more weights of the one or more monitoring indexes with respect to the one or more defects, based on the one or more severities of the one or more monitoring indexes.

In a still further embodiment of the present disclosure, the measurement data processing unit 610 may be configured to determine, from the one or more measurement data, the one or more monitoring indexes related to the one or more defects of the one or more components; and determine, based on the predetermined severity criteria, the one or more severities for the one or more monitoring indexes related to the one or more defects of the one or more components.

In a yet further embodiment of the present disclosure, the apparatus 600 may further comprise a prompt/command provision unit 670. The prompt/command provision unit 670 may be configured to provide, in response to at least one of the defect probability, the defective component probability and the reliability, a prompt and/or a command so as to take a corresponding measure.

In a yet further embodiment of the present disclosure, the apparatus 600 may further comprise a verifying/modifying unit 680. The verifying/modifying unit 680 may be configured to verify and/or modify at least one of the predetermined severity criteria and the effectiveness of the one or more monitoring indexes, based on the defect probability that at least one of the one or more components has at least one of the one or more defects and an event associated with the defect probability.

It is noted that the apparatus 600 may be configured to implement functionalities as described with reference to FIG. 1 to FIG. 5. Therefore, for details about the operations of modules in these apparatus, one may refer to those descriptions made with respect to the respective steps of the methods with reference to FIGS. 1 to 5.

It is further noted that the components of the apparatus 600 may be embodied in hardware, software, firmware, and/or any combination thereof. For example, the components of apparatus 600 may be respectively implemented by a circuit, a processor or any other appropriate device with sufficient data processing power. Those skilled in the art will appreciate that the aforesaid examples are only for illustration instead of limitation.

In some embodiment of the present disclosure, the apparatus 600 may comprise at least one processor. The at least one processor suitable for use with embodiments of the present disclosure may include, by way of example, both general and special purpose processors already known or developed in the future. The apparatus 600 may further comprise at least one memory. The at least one memory may include, for example, semiconductor memory devices, e.g., RAM, ROM, EPROM, EEPROM, and flash memory devices. The at least one memory may be used to store program of computer executable instructions. The program can be written in any high-level and/or low-level compliable or interpretable programming languages. In accordance with embodiments, the computer executable instructions may be configured, with the at least one processor, to cause apparatus 600 to at least perform operations according to the method as discussed with reference to FIGS. 1 to 5.

It should be appreciated that the present disclosure is quite suitable for transformer, especially power transformer, more especially high-voltage (HV) power transformer but it is to limited thereto. The present disclosure may also be feasible to apply to any other suitable such as circuit breaker, power switch, recloser, and so on.

It should also be appreciated that in describing embodiments of the present invention, many specific equations, tables, plot, s parameter values, and so on are given; however the present invention is not limited thereto, it may use any other suitable equations, tables, plot, s parameter values, and so on.

Additionally, based on the above description, the skilled in the art would appreciate that the present disclosure may be embodied in an apparatus, a method, or a computer program product. In general, the various exemplary embodiments may be implemented in hardware or special purpose circuits, software, logic or any combination thereof. For example, some aspects may be implemented in hardware, while other aspects may be implemented in firmware or software which may be executed by a controller, microprocessor or other computing device, although the disclosure is not limited thereto. While various aspects of the exemplary embodiments of this disclosure may be illustrated and described as block diagrams, flowcharts, or using some other pictorial representation, it is well understood that these blocks, apparatus, systems, techniques or methods described herein may be implemented in, as non-limiting examples, hardware, software, firmware, special purpose circuits or logic, general purpose hardware or controller or other computing devices, or some combination thereof.

The various blocks shown in the companying drawings may be viewed as method steps, and/or as operations that result from operation of computer program code, and/or as a plurality of coupled logic circuit elements constructed to carry out the associated function(s). At least some aspects of the exemplary embodiments of the disclosures may be practiced in various components such as integrated circuit chips and modules, and that the exemplary embodiments of this disclosure may be realized in an apparatus that is embodied as an integrated circuit, FPGA or ASIC that is configurable to operate in accordance with the exemplary embodiments of the present disclosure.

While this specification contains many specific implementation details, these should not be construed as limitations on the scope of any disclosure or of what may be claimed, but rather as descriptions of features that may be specific to particular embodiments of particular disclosures. Certain features that are described in this specification in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Various modifications, adaptations to the foregoing exemplary embodiments of this disclosure may become apparent to those skilled in the relevant arts in view of the foregoing description, when read in conjunction with the accompanying drawings. Any and all modifications will still fall within the scope of the non-limiting and exemplary embodiments of this disclosure. Furthermore, other embodiments of the disclosures set forth herein will come to mind to one skilled in the art to which these embodiments of the disclosure pertain having the benefit of the teachings presented in the foregoing descriptions and the associated drawings.

Therefore, it is to be understood that the embodiments of the disclosure are not to be limited to the specific embodiments disclosed and that modifications and other embodiments are intended to be included within the scope of the appended claims. Although specific terms are used herein, they are used in a generic and descriptive sense only and not for purposes of limitation.

What is claimed is:

1. A method for defect pre-warning of an electrical power device, comprising:
   processing one or more measurement data regarding one or more mechanical and/or electrical components of the electrical power device based on predetermined severity criteria, to obtain one or more severities of one or more monitoring indexes related to one or more defects of the one or more mechanical and/or electrical components;
   determining one or more weights of the one or more monitoring indexes with respect to the one or more defects, based on effectiveness of the one or more monitoring indexes for the one or more defects;
   estimating a defect probability that at least one of the one or more mechanical and/or electrical components has each of at least one of the one or more defects, based on the one or more severities and the one or more weights;
   estimating a defect confidence that the at least one of the one or more mechanical and/or electrical components has each of the at least one of the one or more defects, based on the one or more weights and the effectiveness of the one or more monitoring indexes; and
   estimating a defective component probability that the at least one of the one or more mechanical and/or electrical components is a defective component based on the defect probability and the defect confidence;
   wherein the electrical power device includes a mechanical component in the form of a bushing such that the estimating the defective component probability is structured to determine a probability of defect of the bushing in the electrical power device; and
   wherein the defect of the bushing in the electrical power device includes any of: an indication of contamination of the bushing, an indication of a dielectric defect of the bushing, an indication of a mechanical defect of the bushing, and an indication of a thermal defect of the bushing.

2. The method according to claim 1, further comprising: estimating a reliability of the power device based on the defective component probability.

3. The method according to claim 2, further comprising: providing, in response to at least one of the defect probability, the defective component probability and the reliability, a prompt and/or a command so as to take a corresponding measure.

4. The method according to claim 1, further comprising: adjusting the one or more weights of the one or more monitoring indexes with respect to the one or more defects, based on the one or more severities of the one or more monitoring indexes.

5. The method according to claim 1, wherein the processing one or more measurement data regarding one or more components of the power device comprises:
   determining, from the one or more measurement data, the one or more monitoring indexes related to the one or more defects of the one or more components; and
   determining, based on the predetermined severity criteria, the one or more severities for the one or more monitoring indexes related to the one or more defects of the one or more components.

6. The method according to claim 1, wherein at least one of the predetermined severity criteria or the effectiveness of the one or more monitoring indexes for the one or more defects are obtained by an off-line processing based on historical data statics.

7. The method according to claim 1, further comprising: verifying and/or modifying at least one of the predetermined severity criteria and the effectiveness of the one or more monitoring indexes, based on the defect probability and an event associated with the defect probability.

8. The method according to claim 1, wherein the power device comprises a transformer.

9. The method according to claim 1, wherein the electrical power device includes an electrical component in the form of windings such that the estimating the defective component probability is structured to determine a probability of defect of the windings in the electrical power device.

10. An apparatus for defect pre-warning of an electrical power device, comprising:
- a measurement data processing unit, configured to process one or more measurement data regarding one or more mechanical and/or electrical components of the electrical power device based on predetermined severity criteria, to obtain one or more severities of one or more monitoring indexes related to one or more defects of the one or more mechanical and/or electrical components;
- an index weight determination unit, configured to determine one or more weights of the one or more monitoring indexes with respect to the one or more defects, based on effectiveness of the one or more monitoring indexes for the one or more defects;
- a defect probability estimation unit, configured to estimate a defect probability that at least one of the one or more mechanical and/or electrical components has each of at least one of the one or more defects, based on the one or more severities and the one or more weights;
- a defect confidence estimation unit, configured to estimate a defect confidence that the at least one of the one or more mechanical and/or electrical components has each of the at least one of the one or more defects, based on the one or more weights and the effectiveness of the one or more monitoring indexes; and
- a defective component probability estimation unit configured to estimate a defective component probability that the at least one of the one or more mechanical and/or electrical components is a defective component based on the defect probability and the defect confidence;
- wherein the electrical power device includes a mechanical component in the form of a bushing such that the defective component probability estimation unit is structured to determine a probability of defect of the bushing in the electrical power device; and
- wherein the defect of the bushing in the electrical power device includes any of: an indication of contamination of the bushing, an indication of a dielectric defect of the bushing, an indication of a mechanical defect of the bushing, and an indication of a thermal defect of the bushing.

11. The apparatus according to claim 10, further comprising: a device reliability estimation unit, configured to estimate a reliability of the power device based on the defective component probability.

12. The apparatus according to claim 11, further comprising:
- a prompt/command provision unit, configured to provide, in response to at least one of the defect probability, the defective component probability and the reliability, a prompt and/or a command so as to take a corresponding measure.

13. The apparatus according to claim 10, further comprising:
- an index weight adjustment unit, configured to adjust the one or more weights of the one or more monitoring indexes with respect to the one or more defects, based on the one or more severities of the one or more monitoring indexes.

14. The apparatus according to claim 10, wherein the measurement data processing unit is configured to:
- determine, from the one or more measurement data, the one or more monitoring indexes related to the one or more defects of the one or more components; and
- determine, based on the predetermined severity criteria, the one or more severities for the one or more monitoring indexes related to the one or more defects of the one or more components.

15. The apparatus according to claim 10, further comprising:
- a verifying/modifying unit, configured to verify and/or modify at least one of the predetermined severity criteria and the effectiveness of the one or more monitoring indexes, based on the defect probability and an event associated with the defect probability.

* * * * *